United States Patent [19]
Nunokawa et al.

[11] Patent Number: 6,011,281
[45] Date of Patent: Jan. 4, 2000

[54] SEMICONDUCTOR DEVICE HAVING AN OHMIC CONTACT AND A SCHOTTKY CONTACT, WITH A BARRIER LAYER INTERPOSED BETWEEN THE OHMIC CONTACT AND THE SCHOTTKY CONTACT

[75] Inventors: Mitsuji Nunokawa; Yutaka Sato, both of Yamanashi, Japan

[73] Assignee: Fujitsu Quantum Devices Limited, Yamanashi, Japan

[21] Appl. No.: 09/203,335

[22] Filed: Dec. 2, 1998

[30] Foreign Application Priority Data

Dec. 2, 1997 [JP] Japan .................................. 9-331383

[51] Int. Cl.$^7$ ............................................... H01L 31/0328
[52] U.S. Cl. ........................ 257/192; 257/281; 257/751; 257/764; 257/770
[58] Field of Search ..................................... 257/192, 751, 257/763, 764, 768, 769, 770, 750, 183, 754, 741, 734

[56] References Cited

U.S. PATENT DOCUMENTS 5,811,843  9/1998  Yamamoto et al. ..................... 257/194

Primary Examiner—Tom Thomas
Assistant Examiner—Douglas W. Owens
Attorney, Agent, or Firm—Armstrong, Westerman, Hattori, McLeland & Naughton

[57] ABSTRACT

A semiconductor device includes an ohmic electrode and a Schottky electrode respectively carrying interconnection patterns with intervening adhesion layer and a diffusion barrier layer, wherein the Schottky electrode further includes a metal layer that prevents a reaction between the Schottky electrode and the diffusion barrier layer such that the metal layer is interposed between the top surface of the Schottky electrode and adhesion layer for increasing the distance between the diffusion barrier layer and the Schottky electrode.

18 Claims, 6 Drawing Sheets

SEMICONDUCTOR DEVICE HAVING AN OHMIC CONTACT AND A SCHOTTKY CONTACT, WITH A BARRIER LAYER INTERPOSED BETWEEN THE OHMIC CONTACT AND THE SCHOTTKY CONTACT

BACKGROUND OF THE INVENTION

The present invention generally relates to semiconductor devices and more particularly to a semiconductor device having an ohmic contact and a Schottky contact respectively containing Au and Al as primary component, such as a HEMT or MESFET, and a fabrication process thereof. It should be noted, however, that the present invention is by no means limited to a HEMT or MESFET, but is applicable also to other semiconductor devices including Si semiconductor devices.

Compound semiconductor devices use a compound semiconductor material for the active part of the semiconductor device such as a channel layer and achieves a very high operational speed due to the characteristically small effective mass of electron in such a compound semiconductor material. Thus, HEMTs and MESFETs are used extensively in microwave applications such as portable telephones or satellite receivers.

In a HEMT or MESFET, a Schottky gate electrode is provided for controlling the flow of electrons through a channel layer from an ohmic source electrode to an ohmic drain electrode, wherein a refractory metal such as W has been used for the Schottky gate electrode due to the small resistance of W. On the other hand, in view of reducing the resistance of the Schottky gate electrode further, it has become apparent that a gate electrode having an inverted T-shape structure is advantageous, and in relation to this, the use of Al, which is a material used traditionally for the gate electrode of old generation compound semiconductor devices, is regaining interest for the gate electrode of modern, leading edge compound semiconductor devices.

When using Al for the gate electrode of a compound semiconductor material, on the other hand, it is necessary to provide a barrier layer for suppressing diffusion of Al from the gate electrode to a wiring pattern formed of Au or an Au alloy, the wiring pattern being provided for interconnecting the active devices such as HEMT in an integrated circuit.

FIGS. 1A–1C show the process of fabricating a conventional HEMT 10.

Referring FIG. 1A, an undoped buffer layer (not shown) of GaAs is provided on a semi-insulating GaAs substrate 11 by an MOVPE process or MBE process, and an active layer 12 of undoped GaAs is provided further on the buffer layer by a similar epitaxial process. Further, an electron supplying layer 13 of n-type AlGaAs is grown epitaxially on the active layer 12, and there is formed a two-dimensional electron gas 12A in the active layer 12 along an interface to the electron supplying layer 13.

The electron supplying layer 13 is covered by a cap layer 14 of n$^+$-type GaAs, wherein the cap layer 14 is formed with a recess 14A exposing the electron supplying layer 13, and a Schottky electrode of Al is provided on the exposed part of the electron supplying layer 13 as a gate electrode. Further, an ohmic electrode 16 of AuGe/Au or AuGe/Ni/Au structure is provided on the cap layer 14 as a source electrode or a drain electrode. Further, a device isolation region 17 is provided at the outer side of the ohmic electrode 16 by an ion implantation of a deep impurity element such as Fe or O, such that the device isolation region 17 penetrate through the active layer 12 and reaches the substrate 11.

In the actual process, a resist layer is formed after the cap layer 17 is formed but before the formation of the gate recess 14A, followed by a photolithographic patterning process thereof so as to expose the surface of the cap layer 17 on which the ohmic electrode 16 is to be formed. Further, a conductive layer of the AuGe/Au or AuGe/Ni/Au structure is deposited on the resist pattern thus formed such that the ohmic electrode 16 is formed on the exposed surface of the cap layer 17. By lifting off the resist pattern, the ohmic electrode 16 is left on the cap layer 14 as indicated in FIG. 1A.

The formation of the gate electrode 15 proceeds as follows.

After the formation of the ohmic electrode 16 and removal of the resist pattern, a new resist layer is deposited on the cap layer 17 so as to cover the ohmic electrode 16, followed by a photolithographic patterning process to expose a part of the cap layer 17 on which the gate recess 14A is to be formed. Next, a dry etching process is applied to the exposed part of the cap layer 14 while using the resist pattern thus formed as a mask, so as to form the gate recess 14A, and an Al layer is deposited on the resist pattern thus formed uniformly, such that the Al layer fills the gate recess 14A. By lifting off the resist pattern, the gate electrode 15 of Al is left in the gate recess 14A in Schottky contact with the underlying electron supplying layer 13.

Next, in the step of FIG. 1B, a resist layer 18 is deposited on the structure of FIG. 1A, followed by a patterning process to expose the ohmic electrode 16 and the Schottky electrode 15. The resist pattern 18 thus formed is then subjected to reflowing, and a diffusion barrier layer 20 of TiWN is deposited thereon, with an intervening Ti layer 19 between the resist pattern 18 and the diffusion barrier layer 20. Further, a gold (Au) layer 21 is deposited on the TiN layer 20.

Further, in the step of FIG. 1C, the Au layer 21 and the underlying TiWN/Ti layers 19 and 20 are patterned by a photolithographic process to form interconnection patterns 21A and 21B. Further, the underlying resist pattern 18 is also removed.

In the structure of FIG. 1C, the diffusion barrier layer 20 prevents the formation of high resistance layer in the Au layer 21 caused by reaction with Al, by suppressing the diffusion of Al from the gate electrode 15 to the Au layer 21. Further, the Ti layer 19 underneath the diffusion barrier layer 20 prevents the nitridation of the Al gate electrode 15, which in turn is caused by N released from the nitride diffusion barrier layer 20. In the construction of FIG. 1C, it should be noted that a TiN layer may be used for the diffusion barrier layer 20 in place of the TiWN layer. The Ti layer 19 also acts as an adhesion layer between the ohmic electrode 16 and the TiN layer 20 or between the gate electrode 15 and the TiN layer 20.

In the foregoing patterning step of FIG. 1C, there is a problem in that a part of the Ti layer 19 remains unetched due to the oxide formation which tends to occur on the surface of the Ti layer 19 when the Ti layer 19 is patterned by an RIE process using $SF_6$ as an etching gas. Further, there may be a redeposition of Ti which is once removed by the etching process. It should be noted that such a residue of Ti is formed uniformly all over the device except for the part covered by the interconnection pattern 21A or 21B and tends to cause a short-circuit or other undesirable problems. Thus, the device including such a Ti residue has been rejected as a defective device, while such a rejection reduces the yield of the semiconductor device substantially.

It is known that the foregoing problem of Ti residue can be reduced by reducing the thickness of the Ti layer 19. However, the inventor of the present invention has discovered that such a reduction in the thickness of the Ti layer 19 increases the contact resistance, particularly in the case of the Ti layer 19 covering the Al gate electrode 15.

FIG. 2 shows the relationship between the contact resistance and the thickness of the Ti layer 19 covering the Al gate electrode 15, wherein the vertical axis represents the resistance for an area having a size of 5 μm×5 μm.

Referring to FIG. 2, it can be seen that the contact resistance increases sharply when the thickness of the Ti layer 19 is reduced below about 100 Å.

The result of FIG. 2 suggests an interpretation that the reduction of thickness of the Ti layer 19 diminishes the effect of gettering of oxygen remaining on the Al gate electrode 15 and that N atoms contained in the TiWN layer 20 on the Ti layer 19 may cause a transit through the thin Ti layer 19 and reach the underlying Al gate electrode 15. It should be noted that such a diffusion of N induces a formation of high resistance AlN in the gate electrode 15.

The problem of the Ti residue formation may be avoided by forming a Ti layer selectively on the gate electrode 15 while omitting the same from the surface of the ohmic electrode 16. In this case, however, the bonding strength of the TiWN layer 20 contacting directly with the ohmic electrode 16 is reduced substantially and the TiWN layer 20 may be peeled off from the ohmic electrode 16. As noted before, the Ti layer 19 acts also as an adhesion layer.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a Schottky electrode, an ohmic electrode and an interconnection pattern, the interconnection pattern being provided on each of the Schottky electrode and the ohmic electrode with a diffusion barrier layer provided on both the Schottky electrode and the ohmic electrode, wherein contact resistance of the Schottky electrode is minimized, formation of etching residue is minimized and a sufficient bonding strength is maintained for the ohmic electrode.

Another object of the present invention is to provide a semiconductor device having a first electrode containing Al as a primary component and a second electrode containing Au as a primary component, said semiconductor device comprising:

a wiring layer containing Au and provided on both of said first electrode and said second electrode, said wiring layer including a metal layer and a conductive barrier layer, said metal layer preventing a reaction of said barrier layer with Al, wherein said metal layer has an increased thickness in a part provided between said first electrode and said barrier layer than in a part provided between said second electrode and said barrier layer.

Another object of the present invention is to provide a semiconductor device, comprising:

a semiconductor substrate;

a Schottky electrode provided on said semiconductor substrate in Schottky contact therewith, said Schottky electrode containing Al;

an ohmic electrode provided on said semiconductor substrate in ohmic contact therewith, said ohmic electrode containing Au;

a first conductive layer provided on said Schottky electrode with a first thickness;

a second conductive layer provided on said first conductive layer with a second thickness smaller than said first thickness;

a third conductive layer provided on said ohmic electrode in ohmic contact therewith, said third conductive layer having a third thickness substantially identical with said second thickness and a composition substantially identical with a composition of said second conductive layer;

a first diffusion barrier layer provided on said second conductive layer;

a second diffusion barrier layer provided on said third conductive layer;

a first interconnection pattern provided on said first diffusion barrier layer, said first interconnection pattern containing Au; and a second interconnection pattern provided on said second diffusion barrier layer, said second interconnection pattern containing Au.

According to the present invention, the thickness of the second and third conductive layers is reduced without inviting a reaction between Al in the Schottky electrode and a component of the diffusion barrier layer, by providing the first conductive layer on the Al gate electrode. Thereby, the problem of increase of the contact resistance of the gate electrode is successfully avoided while reducing the thickness of the second and third conductive layers simultaneously. As a result of the reduction of thickness of the second and third conductive layers, the problem of formation of conductive residue at the time of patterning of the interconnection pattern is also eliminated successfully.

Another object of the present invention is to provide a method of fabricating a semiconductor device, comprising the steps of:

forming an ohmic electrode on a substrate;

forming a Schottky electrode on said substrate by a lift-off process;

forming an adhesion layer in electrical contact with said ohmic electrode and said Schottky electrode;

forming a diffusion barrier layer on said adhesion layer;

forming a conductor layer on said diffusion barrier layer; and patterning said conductor layer together with said diffusion barrier layer and said adhesion layer to form a first interconnection pattern on said Schottky electrode and a second interconnection pattern on said ohmic electrode, said step of forming said Schottky electrode includes a step of forming a conductive pattern on said Schottky electrode simultaneously to said lift-off process.

By forming the conductive pattern on the Schottky electrode simultaneously to the step of formation of the Schottky electrode by lifting-off, it is no longer necessary to apply a dry etching process when forming the conductive pattern, and the risk that a conductive residue may be formed on the substrate after the patterning of the first and second interconnection pattern is successfully avoided.

Other objects and further features of the present invention will become apparent from the following detailed description when read in conjunction with the attached drawings.

DETAILED DESCRIPTION OF THE PREFERRED EMBODIMENTS

[FIRST EMBODIMENT]

Figure 3:
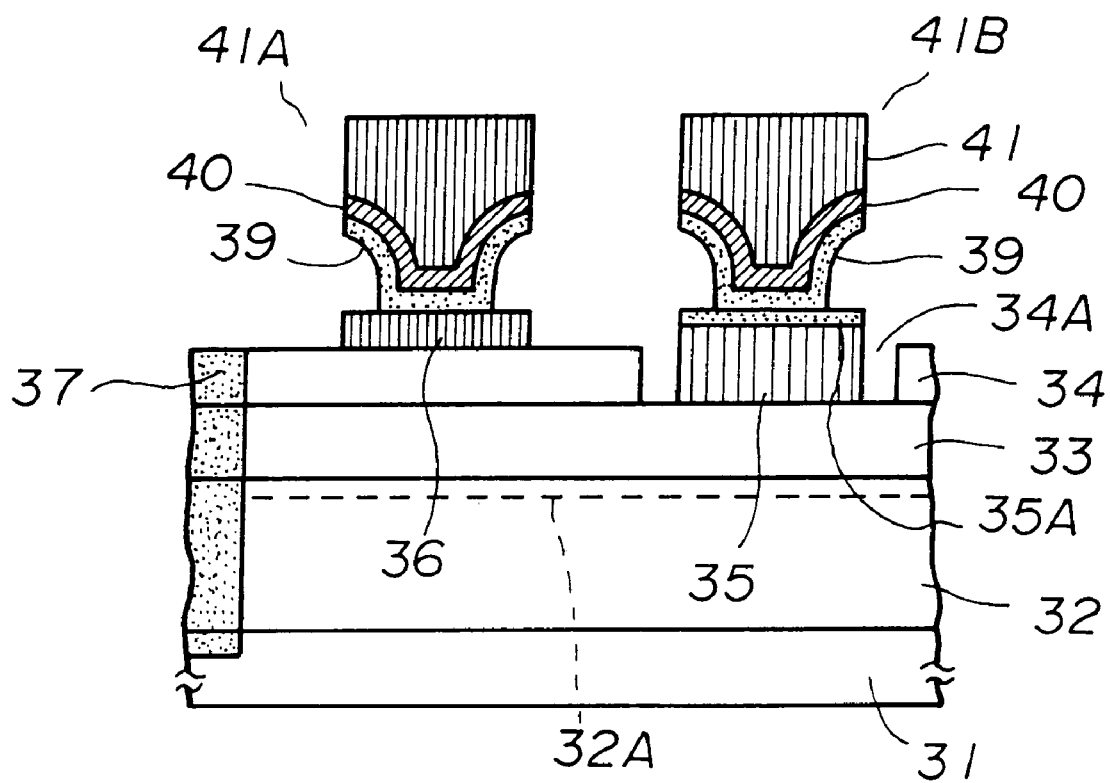
FIG. 3 is a diagram showing the construction of a HEMT according to a first embodiment of the present invention.

FIG. 3 shows the construction of a HEMT 30 according to a first embodiment of the present invention.

Referring to FIG. 3, the HEMT 30 is constructed on a semi-insulating GaAs substrate 31 including an undoped buffer layer of GaAs not illustrated, wherein the HEMT 30 includes an active layer 32 of undoped GaAs formed epitaxially on the buffer layer of the GaAs substrate 31, and there is provided an electron supplying layer 33 of n-type AlGaAs provided epitaxially further on the active layer 31. As a result of contact of the electron supplying layer 33 of n-type AlGaAs with the channel layer 32 of undoped GaAs, there is formed a two-dimensional electron gas 32A in the channel layer 32 along an interface to the electron supplying layer 33.

The electron supplying layer 33 is covered by a cap layer 34 of $n^+$-type GaAs, with a recess 34A formed so as to expose the electron supplying layer 33, and a Schottky electrode 35 of Al is provided on the exposed part of the electron supplying layer 33 as a gate electrode. Further, an ohmic electrode 36 having a AuGe/Au structure or AuGe/Ni/Au structure is provided on the cap layer 34. Further, a device isolation region is formed adjacent to the ohmic electrode 36 by an ion implantation of a deep impurity element such as Fe or O.

On the ohmic electrode 36, there is provided a Ti adhesion layer 39 with a thickness of about 50 Å, and a diffusion barrier layer 40 of TiN or TiWN is provided further on the Ti adhesion layer 39. Further, an interconnection pattern 41A of Au is provided on the diffusion barrier layer 40.

On the Al gate electrode 35, on the other hand, there is provided a Ti layer 35A so as to cover the top surface of the gate electrode 35, and the Ti adhesion layer 39 is provided on the Ti layer 35A thus formed, wherein the Ti layer 35A is deposited with a thickness of about 50 Å or more such that the total thickness of the Ti layer 35A and the Ti adhesion layer 39 becomes 100 Å or more.

On the Ti adhesion layer 39, the diffusion barrier layer 40 of TiWN is provided similarly to the interconnection pattern 41A, and an interconnection pattern 41B is provided on the TiWN barrier layer 40.

In the HEMT 30 of FIG. 3, it should be noted that the increase of the contact resistance of the Al gate electrode 35 is successfully eliminated, while simultaneously reducing the thickness of the Ti adhesion layer 39 on the ohmic electrode 36, by providing the additional Ti layer 35A selectively on the gate electrode 35. Thereby, the problem of formation of the Ti residue at the time of patterning of the interconnection pattern 41A is successfully avoided. As the Ti adhesion layer 39 remains at the interface between the ohmic electrode 36 and the diffusion barrier layer 40, an excellent adherence of the diffusion barrier layer 40 to the ohmic electrode 36 is guaranteed.

In the HEMT 30 of FIG. 3, it should be noted that the inverted T-shaped cross-section for the interconnection patterns 41A and 41B is formed by using a resist process to be described hereinafter in combination with a reflowing process. Further, the Schottky gate electrode 35 may be formed to have an inverted T-shaped cross-sectional form.

FIGS. 4A–4D shows the fabrication process of the HEMT 30 of FIG. 3.

Figure 4A:
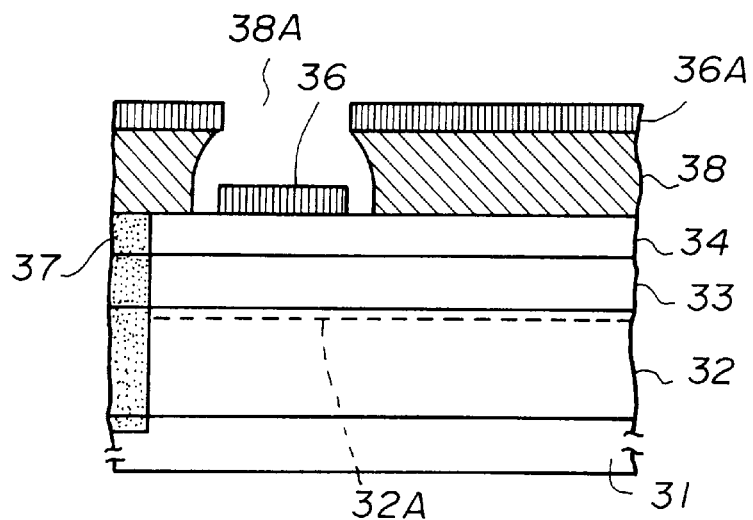
FIGS. 4A–4D are diagrams showing the fabrication process of the HEMT of FIG. 3.

Referring to FIG. 4A, the active layer 32, the electron supplying layer 33 and the cap layer 34 are deposited consecutively on the semi-insulating GaAs substrate, and ion implantation of the deep impurity element such as Fe or O is conducted to form the device isolation region 37.

In the step of FIG. 4A, a resist layer 38 is deposited further on the cap layer 34, followed by a photolithographic patterning process to form an opening 38A exposing a part of the cap layer 34 on which the ohmic electrode is to be formed. Further, a conductor layer 36A having the stacked structure of AuGe/Ni/Au is deposited on the resist layer 38 including the opening 38A by an evaporation deposition process, and the ohmic electrode 36 having the foregoing stacked structure of AuGe/Ni/Au is formed on the cap layer 34 in correspondence to the resist opening 38A. Further, the conductor layer 36A on the resist layer 38 is removed by lifting off the resist layer 38. After removing the resist layer 38, the ohmic electrode 36 is subjected to an allying process.

Figure 4B:
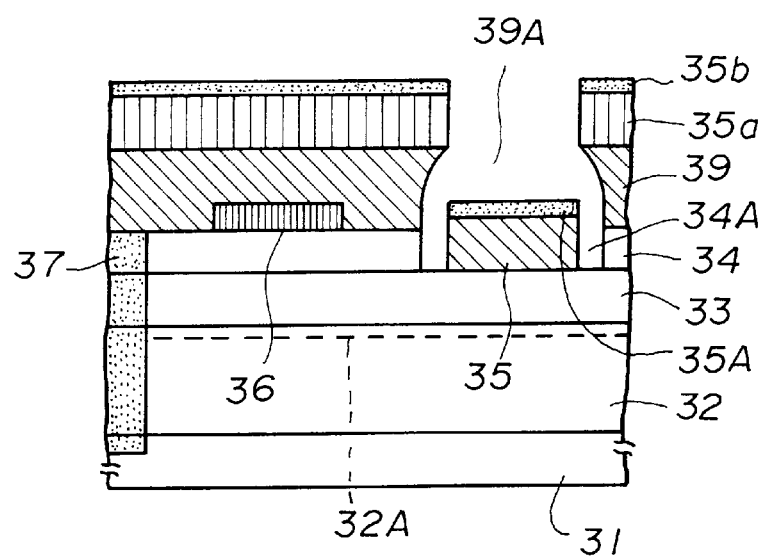

Next, in the step of FIG. 4B, a new resist layer 39 is deposited on the cap layer 34 so as to cover the ohmic electrode 36, followed by a photolithographic patterning process to expose a part of the cap layer 34 in which the gate recess 34A is to be formed. Further, the gate recess 34A is formed by applying a dry etching process to the cap layer 34 while using the resist layer 38 as a mask such that the electron supplying layer 33 is exposed in correspondence the gate recess 34A.

In the step of FIG. 4B, an Al layer 35a and a Ti layer 35b are deposited further on the resist layer 39 thus formed with the opening 39A by an evaporation deposition process or a sputtering process, to form the Al gate electrode 35 covered with the Ti layer 35A on the electron supplying layer 33 in correspondence to the resist opening 39A and hence the gate recess 34A. Typically, the Al layer 35a is formed with a thickness of 1000–8000 Å, preferably about 7000 Å, while the Ti layer 35b may be formed with a thickness of 50–100 Å, preferably about 50 Å.

In FIG. 4B, it should be noted that the Al gate electrode 35 and the Ti layer 35A thereon are patterned in a self-alignment process that uses the resist opening 39A. No dry etching process or RIE process is needed for the Ti layer 35b for forming the Ti layer 35a, and the problem of Ti residue formation on the exposed surface of the cap layer 34 is effectively avoided. Anyway, the cap layer 34 is covered by the resist layer 39 except for the gate recess 39A.

Figure 4C:
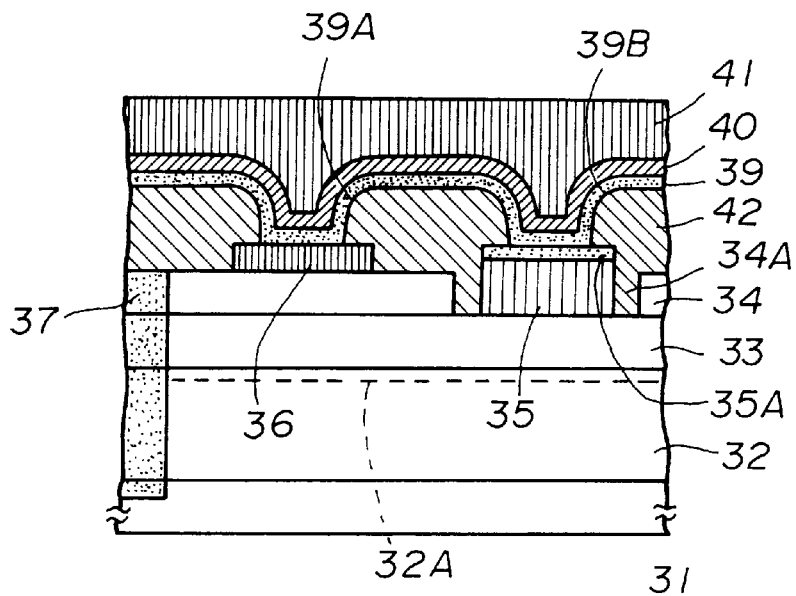

Next, the Al layer 35a and the Ti layer 35b on the resist layer 39 are removed together with the resist layer 39 by lifting off the resist layer 39, and a new resist layer 42 is deposited on the cap layer 34 in the step of FIG. 4C such that the resist layer 42 covers the ohmic electrode 36 and the gate electrode 35 including the Ti layer 35A. The resist layer 39 thus formed is then patterned to form openings 39A and 39B respectively exposing the ohmic electrode 36 and the Ti layer 35A on the gate electrode 35, followed by a reflowing process to blunt the edge of the resist openings 39A and 39B.

After the reflowing process of the resist layer 42, the Ti layer 39 and the TiWN diffusion barrier layer 40 are deposited consecutively on the resist layer 42 in electrical contact with the ohmic electrode 36 and the Ti layer 35A on the Al gate electrode 35 respectively at the resist openings 39A and 39B, and the Au layer 41 is deposited further on the TiWN layer 40 thus formed Typically, the Ti layer 39 is formed by an evaporation deposition process or a sputtering process with a thickness of 50–100 Å, preferably about 50 Å, while the TiWN diffusion barrier layer 40 is formed by a reactive sputtering process with a thickness of about 1000 Å. Further, the Au layer 41 is deposited on the TiWN diffusion barrier layer 40 by an evaporation deposition process with a thickness of about 3 μm, for example.

Figure 4D:
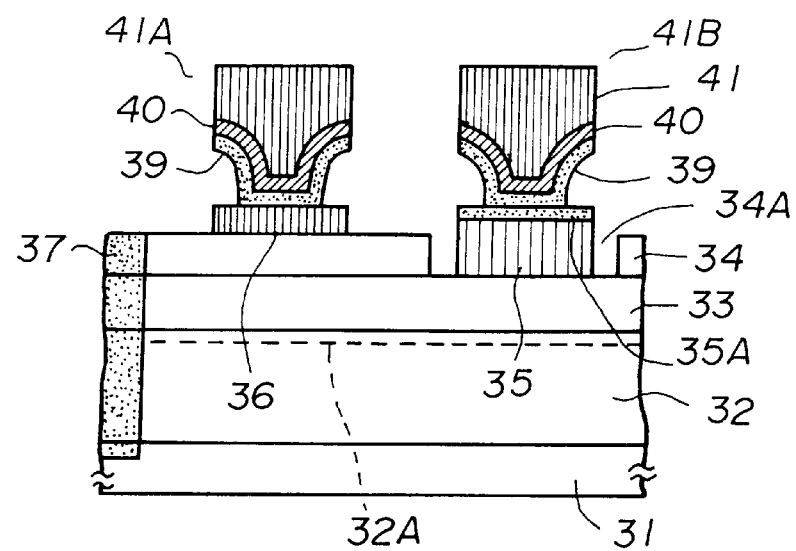

Further, in the step of FIG. 4D, the Au layer 41 and the underlying layers 40 and 39 of TiWN and Ti are patterned by using an RIE process, wherein the patterning of the Au layer is conducted by using an etching gas containing Cl such as $Cl_2$. Further, the patterning of the TiWN layer 40 and the underlying Ti layer 39 is conducted while using $SF_6$ as the etching gas. The problem of the Ti residue formation at the time of the RIE process is successfully avoided in the step of FIG. 4D by reducing the thickness of the Ti layer 39 to be less than about 100 Å, preferably about 50 Å.

In the construction of FIG. 4D, which is identical with the construction of FIG. 3, it should be noted that the total thickness of the Ti layer interposed between the Al gate electrode 35 and the TiWN diffusion barrier layer 40 is given by the sum of the Ti layer 35A and the Ti layer 39, wherein the value of the total thickness exceeds 100 Å in the foregoing construction and the problem of increase of the contact resistance of the Al gate electrode 35 explained before with reference to FIG. 2 is effectively avoided. Further, the Au layer 21 is held stably on the ohmic electrode 36 with excellent mechanical strength due to the existence of the Ti layer 39 acting as an adhesion layer.

Figure 1A:
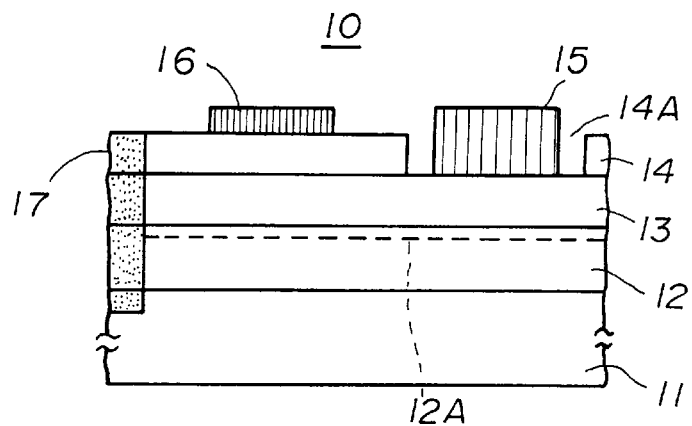
FIGS. 1A–1C are diagrams showing the fabrication process of a conventional HEMT.
Figure 1B:
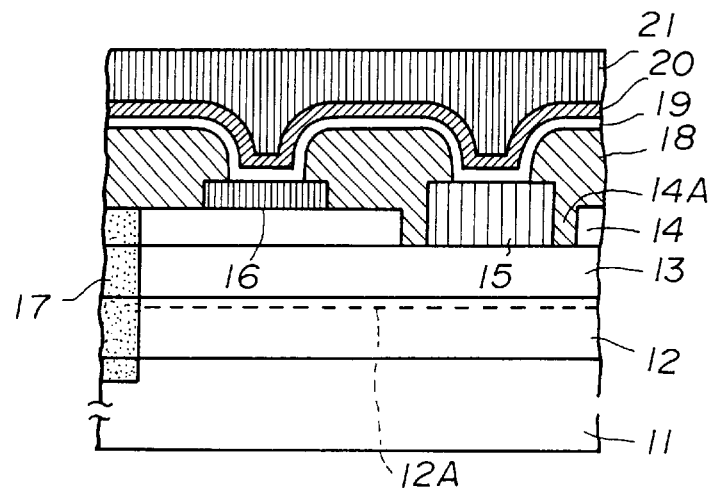
Figure 1C:
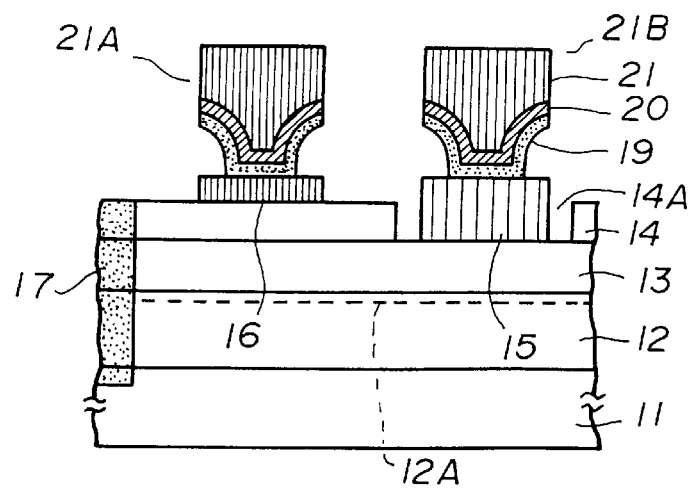
Figure 2:
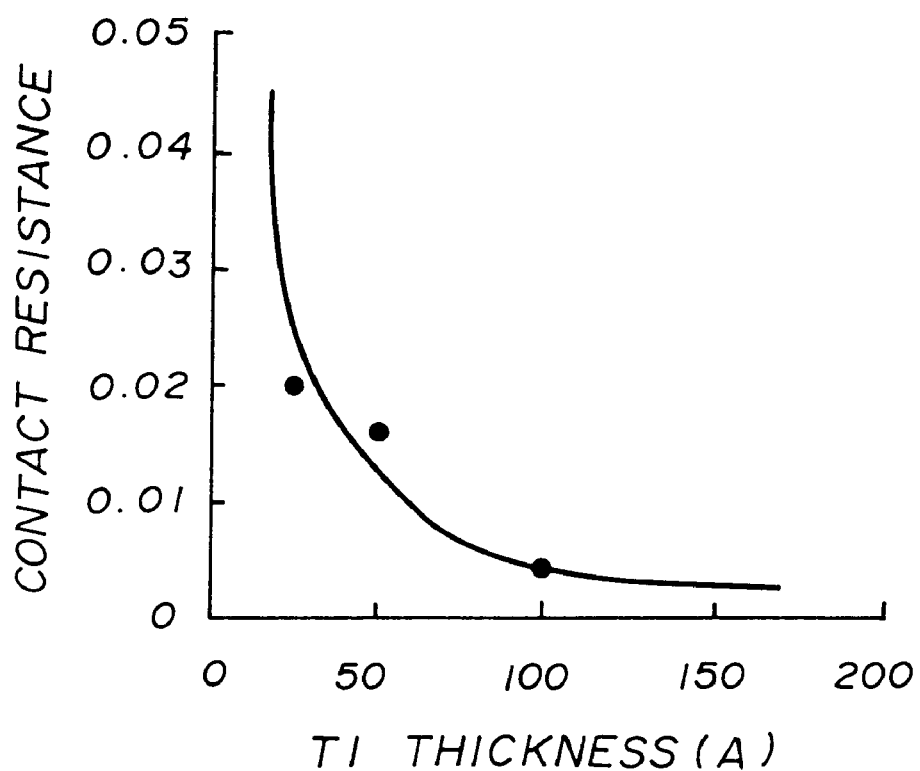
FIG. 2 is a diagram showing the increase of contact resistance of a Schottky electrode with decreasing thickness of a Ti layer underlying a TiWN diffusion barrier layer in a conventional HEMT.

In the construction of the present embodiment, it is of course possible to increase the thickness of the Ti layer 35A to be larger than 50 Å while simultaneously decreasing the thickness of the Ti layer 39 to be smaller than 50 Å, as long as the total thickness of the Ti layer on the Al gate electrode 35 exceeds the critical value of about 100 Å indicated in FIG. 2.

Further, the material usable for the layer 35A on the Al gate electrode 35 is not limited to Ti but any conductive material that can effectively suppress the reaction between Al and N may be used, including the materials such as W, Ta, Ni, Cr, Pd or Mo. It should be noted that these metals form a conductive nitride when reacted with N. Further, the material usable for the adhesion layer 39 on the ohmic electrode 36 is not limited to Ti but any conductive material that shows excellent adherence to the Au ohmic electrode 36 may be used, including the materials such as W, Ta, Ni, Cr, Pd, NiCr, TiW or WSi.

Of course, the HEMT to which the present invention is applicable is not limited to the device that uses a two-dimensional electron gas formed in the n-AlGaAs/i-GaAs heterojunction system, but the present invention is applicable also to other HEMTs that use the two-dimensional electron gas formed in other heterojunction systems such as a n-InGaP/i-InGaAs heterojunction system. The HEMT of the present invention may include an undoped spacer layer at the bottom part of the electron supplying layer as usual in the art.

[SECOND EMBODIMENT]

Figure 5:
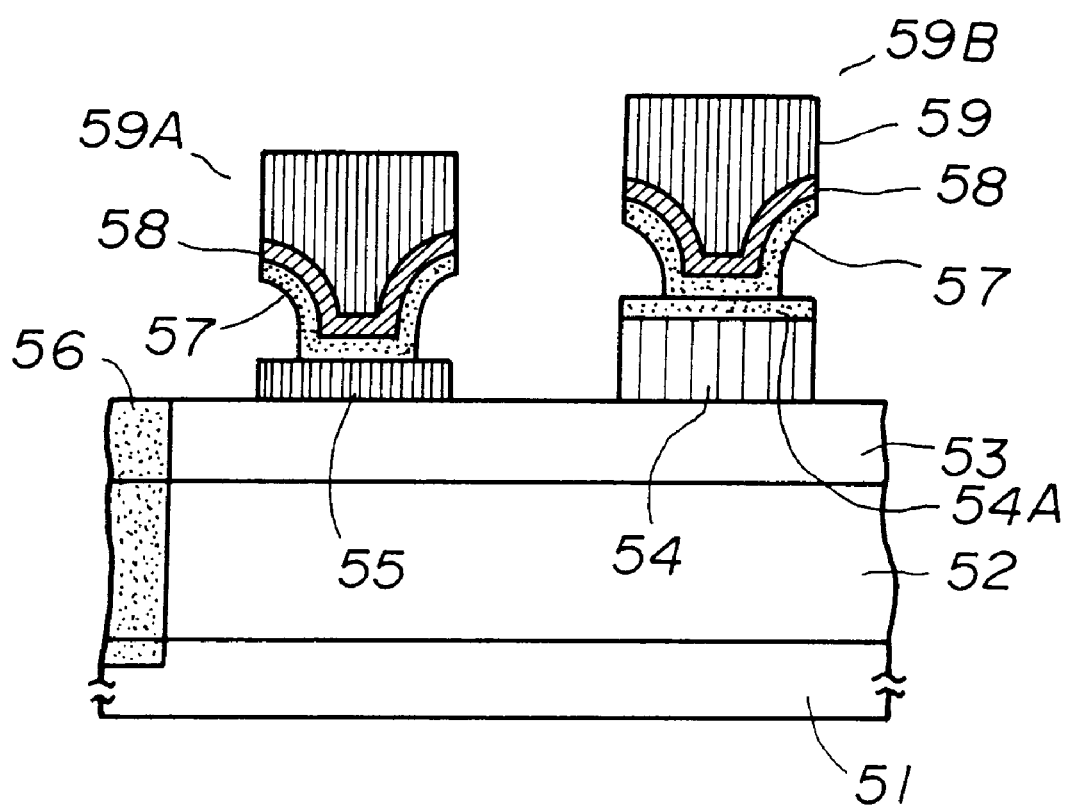
FIG. 5 is a diagram showing the construction of a MES-FET according to a second embodiment of the present invention.

FIG. 5 shows the construction of a MESFET 50 according to a second embodiment of the present invention.

Referring to FIG. 5, the MESFET 50 is constructed on a semi-insulating GaAs substrate 51 carrying thereon an undoped buffer layer 51 of GaAs, wherein the MESFET 50 includes a channel layer 53 of n-type GaAs formed epitaxially on the buffer layer 52, and there is provided a Schottky electrode 54 of Al on the channel layer 53 as a gate electrode. Further, an ohmic electrode 55 having a AuGe/Au structure or AuGe/Ni/Au structure is provided on the channel layer 53 adjacent to the gate electrode 54, and a device isolation region 56 is formed adjacent to the ohmic electrode 55 by an ion implantation of a deep impurity element such as Fe or O.

On the ohmic electrode 55, there is provided a Ti adhesion layer 57 with a thickness of about 50 Å, and a diffusion barrier layer 58 of TiN or TiWN is provided further on the Ti adhesion layer 57. Further, an interconnection pattern 59A of Au is provided on the diffusion barrier layer 58.

On the Al gate electrode 54, on the other hand, there is provided a Ti layer 54A so as to cover the top surface of the gate electrode 54, and the Ti adhesion layer 57 is provided on the Ti layer 54A thus formed, wherein the Ti layer 54A is deposited with a thickness of about 50 Å or more such that the total thickness of the Ti layer 54A and the Ti adhesion layer 57 becomes 100 Å or more.

On the Ti adhesion layer 57, the diffusion barrier layer 58 of TiWN is provided similarly to the interconnection pattern 59A, and an interconnection pattern 59B is provided on the TiWN barrier layer 58.

In the MESFET 50 of FIG. 5, it should be noted that the increase of the contact resistance of the Al gate electrode 54 is successfully eliminated, while simultaneously reducing the thickness of the Ti adhesion layer 57 on the ohmic electrode 55, by providing the additional Ti layer 54A selectively on the gate electrode 54. Thereby, the problem of formation of the Ti residue at the time of patterning of the interconnection pattern 59A is successfully avoided. As the Ti adhesion layer 57 remains at the interface between the ohmic electrode 55 and the diffusion barrier layer 58, an excellent adherence of the diffusion barrier layer 58, and hence the interconnection pattern 59A, to the ohmic electrode 55 is guaranteed.

In the MESFET 50 of FIG. 5, it should be noted that the inverted T-shaped cross-section for the interconnection patterns 59A and 59B is formed by using a resist process similar to the process described with reference to FIGS. 4A–4D for the HEMT 30.

Further, the Schottky gate electrode 54 may be formed to have an inverted T-shaped cross-sectional form.

It should be noted that the present invention is applicable also to the case in which a conductive oxide, such as TiO, TaO, SrTiO, and the like, is used for the diffusion barrier layer 40 or 58. In such a case, it is preferable to use a metal, of which oxide shows an excellent conductivity, for the layer 39 or 57.

Further, it should be noted that the gate electrode 35 or 54 is not limited to a Schottky electrode formed of pure Al but also includes a Schottky electrode formed of an Al alloy which may contain Cu or Si.

Further, the present invention is not limited to HEMT or MESFET but is applicable also to HBTs. Further, the present invention is applicable also to the case of silicon devices.

Further, the present invention is not limited to the embodiments described heretofore, but various variations and modifications may be made without departing from the scope of the invention.

What is claimed is:

1. A semiconductor device having a first electrode containing Al as a primary component and a second electrode containing Au as a primary component, said semiconductor device comprising:

a wiring layer containing Au and provided on both of said first electrode and said second electrode, said wiring layer including a metal layer and a conductive barrier layer, said metal layer preventing a reaction of said barrier layer with Al, wherein two said metal layers are provided in a part provided between said first electrode and said barrier layer, the sum of the thickness of said two metal layers being greater than the thickness of said metal layer in a part provided between said second electrode and said barrier layer.

2. A semiconductor device as claimed in claim 1, wherein said two metal layers have a thickness of 100 Å or more in said part between said first electrode and said barrier layer.

3. A semiconductor device as claimed in claim 1, wherein said metal layer has a thickness of 50 Å or more in said part between said second electrode and said barrier layer.

4. A semiconductor device as claimed in claim 1, wherein said metal layer suppresses a nitridation reaction of Al, and wherein said metal layer has a composition such that a nitride of a metal forming said metal layer is a conductive body.

5. A semiconductor device as claimed in claim 4, wherein said metal is selected from a group consisting of Ti, W, Ta, Mo, Pd, Ni and Cr.

6. A semiconductor device as claimed in claim 1, wherein said metal layer suppresses a nitridation reaction of Al, said metal layer has a composition such that a nitride of a metal forming said metal layer is a conductive body, and wherein said metal layer enhances adherence to said second electrode.

7. A semiconductor device as claimed in claim 6, wherein said metal is selected from a group consisting of Ti, W, Ta, Mo, Pd, Ni and Cr.

8. A semiconductor device as claimed in claim 1, wherein said metal layer suppresses oxidation of Al, and wherein said metal layer has a composition such that an oxide of a metal forming said metal layer is a conductive body.

9. A semiconductor device, comprising:

a semiconductor substrate;

a Schottky electrode provided on said semiconductor substrate in Schottky contact therewith, said Schottky electrode containing Al;

an ohmic electrode provided on said semiconductor substrate in ohmic contact therewith, said ohmic electrode containing Au;

a first conductive layer provided on said Schottky electrode with a first thickness;

a second conductive layer provided on said first conductive layer with a second thickness smaller than said first thickness;

a third conductive layer provided on said ohmic electrode in ohmic contact therewith, said third conductive layer having a third thickness substantially identical with said second thickness and a composition substantially identical with a composition of said second conductive layer;

a first diffusion barrier layer provided on said second conductive layer;

a second diffusion barrier layer provided on said third conductive layer;

a first interconnection pattern provided on said first diffusion barrier layer, said first interconnection pattern containing Au; and a second interconnection pattern provided on said second diffusion barrier layer, said second interconnection pattern containing Au.

10. A semiconductor device as claimed in claim 9, wherein said first conductive layer and said second conductive layer have respective thicknesses set such that a total thickness of said first and second conductive layers is about 100 Å or more.

11. A semiconductor device as claimed in claim 9, wherein said first conductive layer suppresses a reaction between said Schottky electrode and said first diffusion barrier layer.

12. A semiconductor device as claimed in claim 9, wherein said first thickness of said first conductive layer is about 50 Å or more.

13. A semiconductor device as claimed in claim 9, wherein said first conductive layer is selected from a group consisting of Ti, W, Ta, Mo, Pd, Ni and Cr.

14. A semiconductor device as claimed in claim 9, wherein said first conductive layer is formed of a metal that forms a conductive nitride when reacted with N.

15. A semiconductor device as claimed in claim 9, wherein said first conductive layer is formed of a metal that forms a conductive oxide when reacted with O.

16. A semiconductor device as claimed in claim 9, wherein said second and third conductive layers are formed of a material selected from Ti, W, Ta, Ni, Cr, Pd, NiCr, TiW and WSi.

17. A semiconductor device as claimed in claim 9, wherein said first and second diffusion barrier layer are formed of a nitride.

18. A semiconductor device as claimed in claim 9, wherein said substrate includes a two-dimensional carrier gas therein.

* * * * *